United States Patent [19]

Minagawa et al.

[11] 4,348,650
[45] Sep. 7, 1982

[54] SURFACE-ACOUSTIC-WAVE PARAMETRIC DEVICE

[75] Inventors: Shoichi Minagawa; Takeshi Okamoto, both of Toda, Japan

[73] Assignee: Clarion Co., Ltd., Tokyo, Japan

[21] Appl. No.: 220,678

[22] Filed: Dec. 29, 1980

[30] Foreign Application Priority Data

Dec. 27, 1979 [JP] Japan ............................ 54-169299

[51] Int. Cl.³ ..................... H03H 9/64; H01L 27/20; H01L 19/00
[52] U.S. Cl. .................................. 333/195; 330/4.9; 333/196; 357/26
[58] Field of Search ................................ 333/193–196, 333/150–155; 330/4.5, 4.6, 4.9, 5, 5.5, 7; 357/26, 25; 310/313 R, 313 A, 313 B, 313 C, 313 D; 364/821

[56] References Cited

U.S. PATENT DOCUMENTS

| | | | |
|---|---|---|---|
| 3,862,431 | 1/1975 | Quate et al. ........................... | 330/5.5 |
| 4,233,530 | 11/1980 | Mikoshiba et al. ............... | 330/5.5 X |
| 4,254,388 | 3/1981 | Mikoshiba et al. ................. | 333/195 |
| 4,288,765 | 9/1981 | Mikoshiba et al. ................. | 333/195 |

Primary Examiner—Marvin L. Nussbaum
Attorney, Agent, or Firm—Blanchard, Flynn, Thiel, Boutell & Tanis

[57] ABSTRACT

A surface-acoustic-wave parametric device characterized in that a width of a parametric interaction region in a direction perpendicular to the propagation direction of surface acoustic wave is varied so as to correspond to a desired frequency characteristic.

10 Claims, 22 Drawing Figures

SURFACE-ACOUSTIC-WAVE PARAMETRIC DEVICE

BACKGROUND OF THE INVENTION

1. Field of the Invention

This invention relates to a surface-acoustic-wave parametric device for use as a variable-frequency selecting device. More particularly, this invention relates to a surface-acoustic-wave parametric device wherein a parametric interaction region has a form corresponding to a desired output frequency characteristic, thereby enabling design of a frequency characteristic of the variable-frequency selecting device to be made as desired.

2. Description of the Prior Art

One of the inventors of the present invention has already disclosed, in Japanese Laying-Open No. 54-41089 (1979), a surface-acoustic-wave device having a variable frequency selecting function as illustrated in FIG. 1.

In FIG. 1, numeral 1 designates a semiconductor substrate, and an insulator film 2 and a piezoelectric layer 3 are laminated on the semiconductor substrate 1. A square pumping electrode 4 to which a DC bias voltage and a pumping voltage are applied, and input and output transducers 5 and 6 are arranged on the piezoelectric layer 3.

Numeral 7 designates a DC power source for applying a DC bias voltage, 8 designates an inductor for AC blocking, 9 designates a high-frequency power source for applying a pumping voltage, 10 is a capacitor for DC blocking, and 11 and 12 designate surface-acoustic-wave absorbing members for preventing undesired reflection of surface acoustic wave at the ends of the device.

The DC bias voltage is applied from the DC power source 7 to the pumping electrode 4 so as to create a suitable depletion-layer capacitance at a surface portion of the semiconductor substrate 1 under the pumping electrode 4. Further, the pumping voltage having a frequency 2fo twice that of a center frequency fo of a desired frequency band is applied from the high-frequency power source 9 to the pumping electrode 4 so that the depletion layer capacitance is caused to oscillate and is modulated at the frequency 2fo.

When an electric signal is applied to the broad-band input transducer 5, the input electric signal is converted into a surface-acoustic-wave signal which is propagated on the surface of the piezoelectric layer 3 rightwardly and leftwardly as viewed in FIG. 1.

In the course that a signal component of the surface-acoustic-wave input signal 13 propagating in the rightward direction, which has a frequency around fo, passes through an operating region under the pumping electrode 4, the piezoelectric potential is subjected to a parametric interaction with the pumping voltage due to the depletion layer capacitance non-linearity effect on the surface of the semiconductor substrate 1 and the component is amplified. This amplified surface-acoustic-wave signal 14 is converted into and outputted in the form of an electric signal from the coutput transducer 6.

At the same time, a surface-acoustic-wave signal 15, which has a frequency fi ($fi=2fo-fs$, fs: a frequency of the input signal corresponding to the amplitude of the surface-acoustic-wave input signal 13, is also produced from the pumping electrode 4 and propagated leftwardly as viewed in FIG. 1. This surface-acoustic-wave signal 15 may also be outputted as an output signal.

The frequency characteristics 14a, 15a, 14b and 15b of the respective output surface-acoustic-wave signals 14 and 15 are shown, in FIGS. 2 and 3, in relation with the input signal 13 whose amplitude is shown as 1 in the figures. FIG. 2 shows the case where the pumping voltage is relatively small and FIG. 3 shows the case where the pumping voltage is relatively large.

As apparent from FIGS. 2 and 3, in the surface-acoustic-wave device having a square pumping electrode, a response at a signal passing band and a spurious response are substantially determined when an output at a desired center frequency fo is selected. By this reason, when the conventional surface-acoustic-wave device is used as a frequency selecting device, the frequency characteristic cannot be designed freely. And yet, the spurious response is still too high to be practically used.

OBJECT OF THE INVENTION

It is therefore an object of the present invention to provide a surface-acoustic-wave parametric device which is capable of obviating the disadvantages involved in the conventional device.

It is another, more specific object of the present invention to provide a surface-acoustic-wave parametric device which is capable of adapting the response in a signal passing band for a desired specification and reducing the spurious response to an extent negligible in a practical use when the device is used as frequency selecting device.

SUMMARY OF THE INVENTION

In accordance with the present invention, there is provided a surface-acoustic-wave parametric device which comprises:

a laminate formed of a semiconductor layer and a piezoelectric layer;

means for applying a pumping voltage to said laminate;

means for inputting surface acoustic wave to said laminate; and means for outputting surface acoustic wave subjected to a parametric interaction;

said laminate having a parametric interaction region having a width perpendicular to a propagation direction of surface acoustic wave which varies, in the propagation direction of the surface acoustic wave, corresponding to a desired frequency characteristic of the output surface acoustic wave.

BRIEF DESCRIPTION OF THE DRAWINGS

FIG. 2 showing the case a pumping voltage is relatively small and FIG. 3 showing the case the pumping voltage is relatively large;

THEORY OF THE INVENTION

According to a common electric circuit theory, an output frequency characteristic of a linear circuit can be obtained by Fourier-transform of time response (time change) at an output when an impulse is applied to an input.

Therefore, if the time response having a relation of Fourier-transform with a desired frequency characteristic is first obtained and the linear circuit is formed so that the time response may be equal to the impulse response, there can be obtained an output signal having the desired frequency characteristic.

This theory will now be described in more detail in connection with its application to the conventional device of FIG. 1, referring to FIGS. 4A to 7B.

Figure 1:
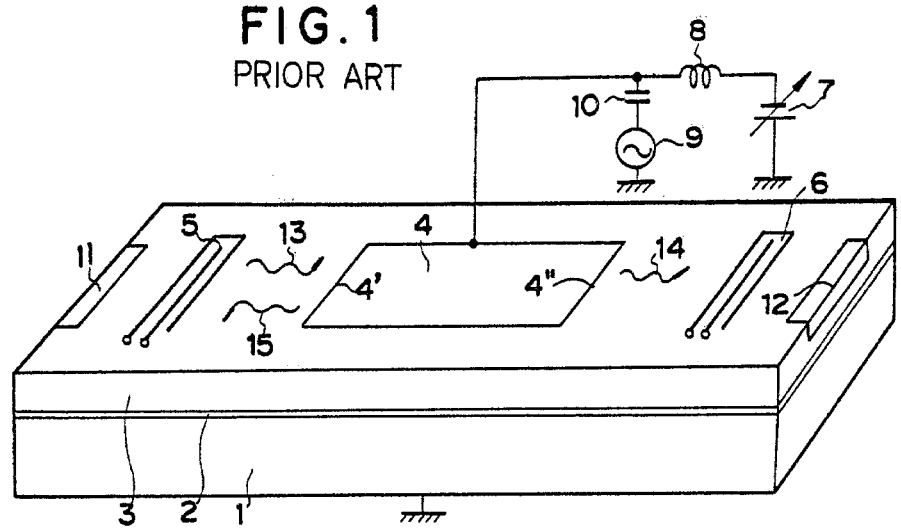
FIG. 1 is a perspective view of a conventional surface-acoustic-wave device.
Figure 4A:
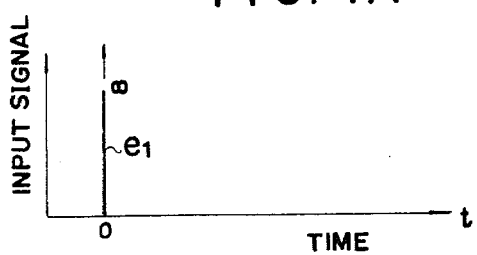
FIG. 4A is a waveform diagram showing an ideal impulse used for design of parametric interaction regions.
Figure 4B:
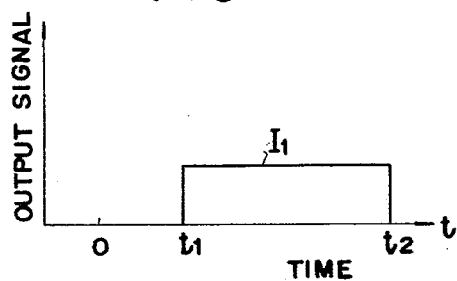
FIG. 4B is a characteristic curve showing one example of a time response when the ideal impulse of FIG. 4A is applied to the device of FIG. 1.

In the surface-acoustic wave parametric device as illustrated in FIG. 1, the parametric interaction is set to be not so large, and an ideal impulse $e_1$ having a duration of 0 as shown in FIG. 4A is inputted to the input transducer 5 for time $t=0$. Time response $I_1$ of output surface acoustic wave 15 (having a frequency fi, of the resultant two surface-acoustic-wave signals outputted rightwardly and leftwardly from the pumping electrode 4, which travels in a direction opposite to that of the input surface acoustic wave 13 is as shown in FIG. 4B. In FIG. 4B, time $t_1$ is a time required for the surface-acoustic-wave signal to reciprocate between the input transducer 5 and a near end 4' of the pumping electrode 4, and time $t_2$ is a time required for the surface-acoustic-wave signal to reciprocate between the input transducer 5 and a remote end 4'' of the pumping electrode 4.

The input impulse $e_1$ and the output time response $I_1$ will be described in more detail. The ideal impulse $e_1$ contains an infinite number of frequency components. When this impulse $e_1$ is inputted through the input transducer 5, only the signal components having a frequency around fo (when the pumping frequency is 2fo), among the infinite number of signal components, are subjected to a parametric interaction and outputted as the backward surface-acoustic-wave signal 15 which travels oppositely to the input surface-acoustic-wave signal 13. The envelope obtained by AM-demodulating the frequency components of the output signal is shown in FIG. 4B in the form of the output time response $I_1$.

Figure 5A:
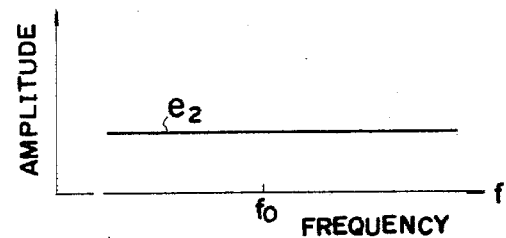
FIG. 5A is a frequency characteristic curve of ideal input surface acoustic wave.
Figure 5B:
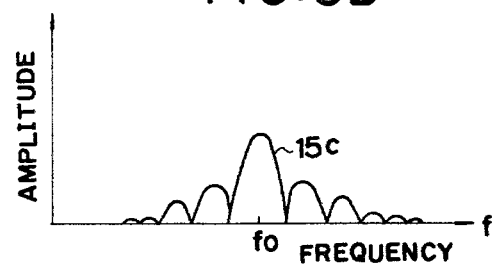
FIG. 5B is a characteristic curve showing a frequency spectrum of backward surface-acoustic-wave output when the ideal input surface acoustic wave of FIG. 5A is applied to the device of FIG. 1.

When a signal $e_2$ having a constant amplitude and including a frequency fo as shown in FIG. 5A is applied, instead of the impulse $e_1$, to the input transducer 5, the backward surface-acoustic-wave output signal 15 has a frequency spectrum 15c as shown in FIG. 5B. The frequency spectrum 15c of FIG. 5B corresponds to the output frequency characteristic shown by 15a in FIG. 2.

The frequency spectrum 15c corresponds to a result of Fourier-transform of the time response $I_1$.

Now, assuming that the frequency spectrum 15c shown in FIG. 5B is the desired frequency characteristic, it is the time response $I_1$ of FIG. 4B that is in relation of Furier Transform with the desired characteristic, and the linear circuit presenting the time response $I_1$, i.e., the surface-acoustic-wave parametric device, is the device having the square pumping electrode 4 as illustrated in FIG. 1.

Figure 6A:
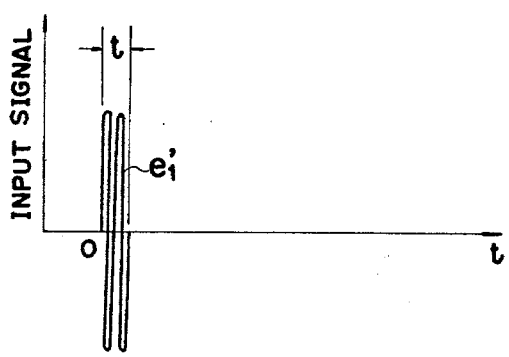
FIG. 6A is a waveform diagram of one example of a RF pulse practically employed instead of the ideal impulse of FIG. 4A.

However, the ideal impulse as described above is, in fact, impracticable. Therefore, RF pulse $e_1'$ having a carrier frequency fo and a duration $t(t < < t_2 - t_1)$ as shown in FIG. 6A is employed.

Figure 6B:
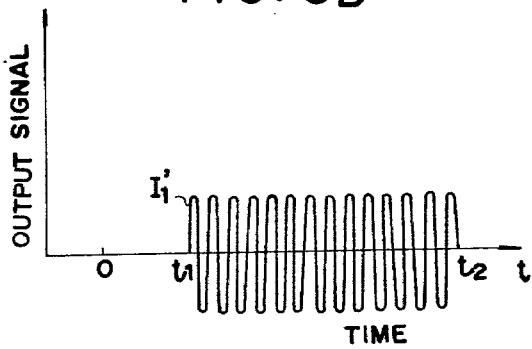
FIG. 6B is a characteristic curve showing one example of time response when the RF pulse of FIG. 6A is applied to the device of FIG. 1.

In this case, the time response $I_1'$ of a backward output signal 15 is as shown in FIG. 6B. When the time response $I_1'$ is subjected to AM demodulation, the obtained envelope is substantially the same as that shown in FIG. 4B. The carrier frequency of the time response output signal $I_1'$ shown in FIG. 6B is $fi = 2fo - fo = fo$.

As compared with the signal $e_2$ having a constant amplitude as shown in FIG. 5A, an actual signal $e_2'$ has an amplitude-attenuation tendency at frequency portions remote from a center frequency fo.

Figure 7A:
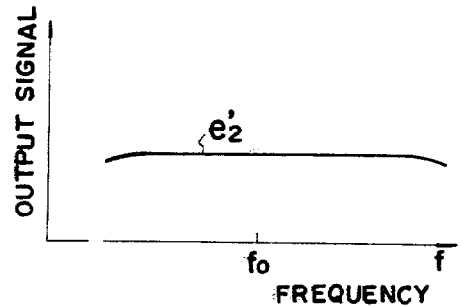
FIG. 7A is a frequency characteristic curve of an input surface acoustic wave practically employed instead of the ideal input surface acoustic wave of FIG. 5A.
Figure 7B:
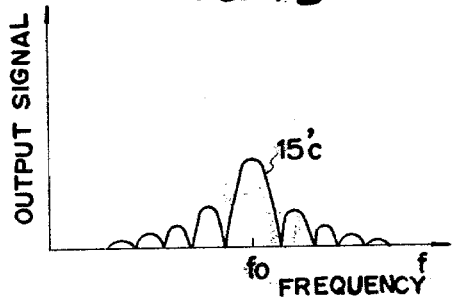
FIG. 7B is a characteristic curve showing a frequency spectrum of backward surface-acoustic-wave output when the input surface acoustic wave of FIG. 7A is applied to the device of FIG. 1.

However, such a signal $e_2'$ is inputted through the transducer 5, a frequency spectrum $15c'$ of a resultant backward output signal is similar to that shown in FIG. 7B. The frequency spectrum $15c'$ is substantially the same as that shown in FIG. 5B.

Practically, in designing a surface-acoustic-wave parametric device according to the desired frequency characteristic (designing a pumping electrode), signals having the constant amplitude as shown in FIGS. 6A and 7A are employed.

DESCRIPTION OF THE EMBODIMENTS

The invention achieved based on the technique as described above will now be described in detail, referring to the embodiment illustrated in from FIGS. 8 on.

In these figures, the same or similar parts and portions as or to those in FIG. 1 are indicated by the same or similar numerals.

Figure 8:
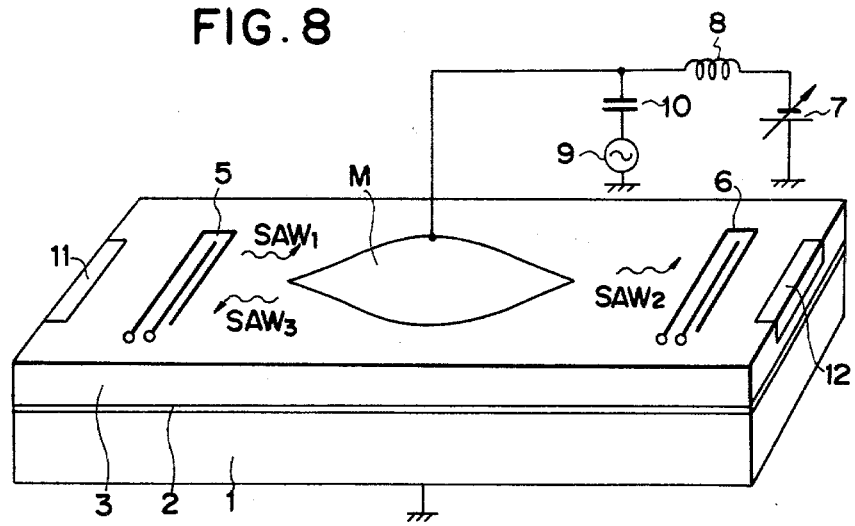
FIG. 8 is a schematic view of one form of surface-acoustic-wave parametric device embodying the present invention, showing a laminate thereof in perspective.

In FIG. 8, 1 is a semiconductor substrate made, for example, of silicon (si). An insulating film 2 and a piezoelectric payer 3 are laid on the semiconductor substrate 1 in the order, to form a laminate.

The insulating film 2 is used for surface passivation of the semiconductor substrate 1 and formed, for example, of silicon dioxide ($SiO_2$). The piezoelectric layer 3 is formed of a piezoelectric material such as zinc oxide (ZnO), aluminum nitride (AlN), etc.

An input transducer 5 and an output transducer 6 are disposed on the laminate at positions near the opposite ends of the laminate, respectively. These input and output transducers 5 and 6 are adapted so as to have a sufficiently broad band characteristic.

On a propagation path for surface acoustic wave between the input transducer 5 and the output transducer 6, there is provided a pumping electrode M formed in accordance with the above-described technique. The procedures for forming the electrode will be described in detail later.

Numeral 7 designates a DC power source for applying a DC bias voltage, 8 is an AC blocking inductor, 9 is a high-frequency power source for applying a pumping voltage, 10 is a DC blocking capacitor.

Numerals 11 and 12 indicate surface-acoustic-wave absorbing members for preventing undesired reflection of surface acoustic wave at the ends of the device.

Procedures to design parametric interaction region, or a pumping electrode M will now be described, referring to the techique as given above.

Figure 9:
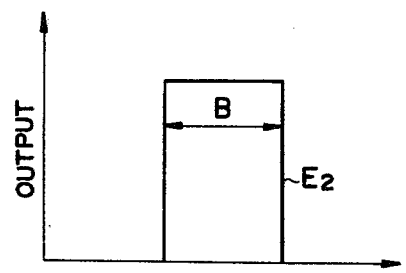
FIG. 9 is a characteristic curve showing a frequency characteristic of an ideal band pass filter.
Figure 10:
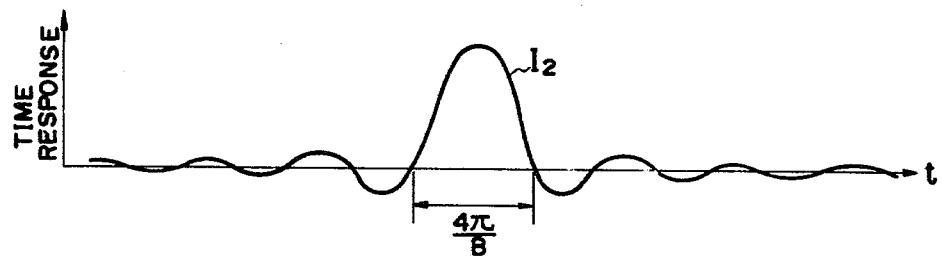
FIG. 10 is a characteristic curve showing time response in relation of Fourier transform with the frequency characteristic of FIG. 9.

It is now assumed that a desired frequency characteristic is a frequency characteristic $E_2$ of an ideal bandpass filter having a band width B as shown in FIG. 9. When time response $I_2$ in a relation of Fourier transform with this frequency $E_2$ is obtained, it is in the form of sin x/x and infinitely extends laterally as shown in FIG. 10.

Figure 11:
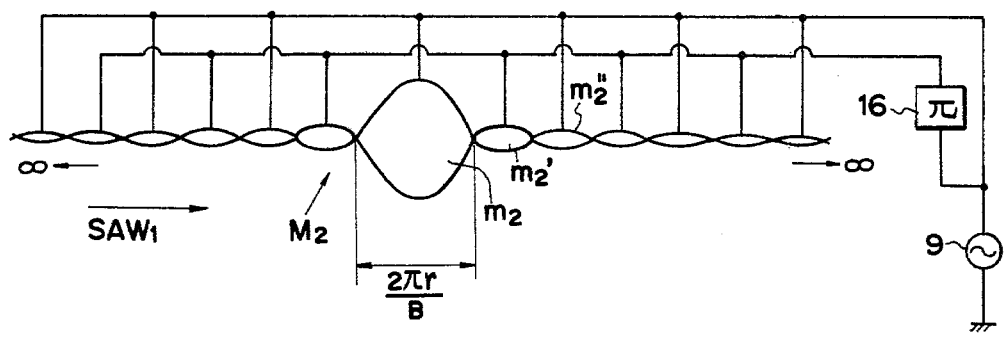
FIG. 11 is a plan view of one example of a pumping electrode formed so as to correspond to the time response of FIG. 10.

In this connection, it is to be noted that the amplitude of a surface-acoustic-wave output signal $SAW_3$ produced by an impulse $e_1$ is substantially in proportion to a size of the parametric interaction region, or a width of the pumping electrode in direction perpendicular to the propagation direction of surface acoustic wave when the pumping voltage is relatively low. Therefore, in order to equalize the time response $I_2$ with the impulse response, the width of the pumping electrode may be formed so as to conform to the waveform of the time response $I_2$ in correspondence therewith. One example of the pumping electrode $M_2$ formed in accordance with the idea is illustrated in FIG. 11. Apexes, or junctions of respective electrode members $m_2$, $m_2'$, $m_2''$ comprising the pumping electrode $M_2$ are electrically insulated. In FIG. 11, numeral 16 designates a phase inverter circuit for changing the phase of the pumping voltage by 180°. As can be seen from FIG. 11, the pumping electrode $M_2$ corresponding to the ideal bandpass filter (FIG. 9) extends infinitely in the lateral direction in FIG. 11. Therefore, it is practically impossible to apply this pumping electrode $M_2$ to the device of FIG. 8 because the size of the laminate is increased infinitely.

By these reasons, a filter characteristic (frequency selecting characteristic) may be deteriorated in so far as it will not cause problems in practical use to allow selection of a suitable length for the pumping electrode for attaining the optimum characteristic within the restriction.

An example of design of practicable parametric interaction region, namely, the shape of the pumping electrode will now be described.

Figure 12A:
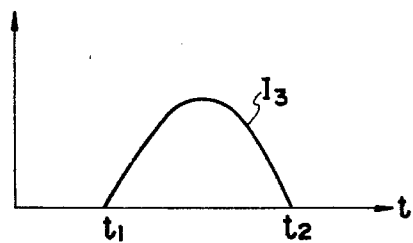
FIG. 12A is a characteristic curve showing impulse response of the characteristic of FIG. 10 with the waveform portion other than $-\pi < x < \pi$ removed.
Figure 12B:
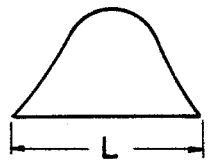
FIGS. 12B and 12C are plan views of other examples of pumping electrodes formed so as to correspond to the impulse response of FIG. 12A.
Figure 12C:
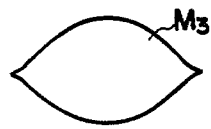

FIG. 12A shows impulse response $I_3$ corresponding to time response which corresponds to the time response of sin x/x of FIG. 10 with waveform portions other than $-\pi < x < \pi$ removed. The examples of the pumping electrode formed so as to correspond to the impulse response $I_3$ are as shown in FIGS. 12B and 12C. Letter L in FIG. 12B is expressed as $L = \{(t_2 - t_1)/2 \times V$ (V: sound velocity of surface acoustic wave). For application to the device of FIG. 8, a pumping electrode formed symmetrical as illustrated in FIG. 12C is employed.

Figure 13:
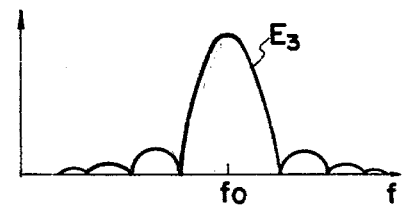
FIG. 13 is a characteristic curve of one example of an output frequency characteristic obtained when the arrangements of FIGS. 12B and 12C are applied to the device of FIG. 8.

When the pumping electrode $M_3$ as shown in FIG. 12C is applied to the device of FIG. 8, the frequency characteristic of the surface-acoustic-wave output signal $SAW_3$ becomes a desired one as shown in FIG. 13.

Figure 2:
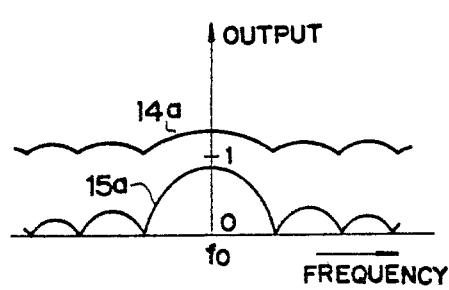
FIGS. 2 and 3 are characteristic curves of output frequency characteristics of the device shown in FIG. 1.
Figure 3:
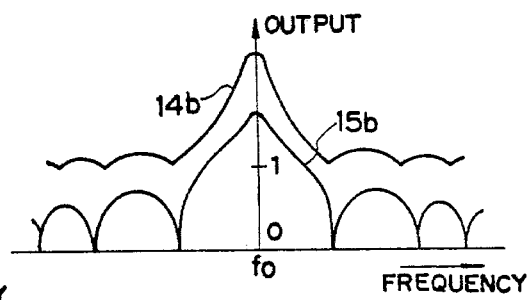

When this frequency characteristic $E_3$ is compared with the frequency characteristic $E_2$ of the ideal bandpass filter as shown in FIG. 9, there can be seen deterioration in a knee characteristic of the filter, but the spurious response is markedly reduced as compared with that of the known device as shown in FIG. 2 to such an extent that it is negligible in a practical use.

Therefore, the pumping electrode $M_3$ as shown in FIG. 12C is applicable as a pumping electrode for a surface acoustic wave parametric device providing the desired frequency characteristic $E_3$.

Figure 14A:
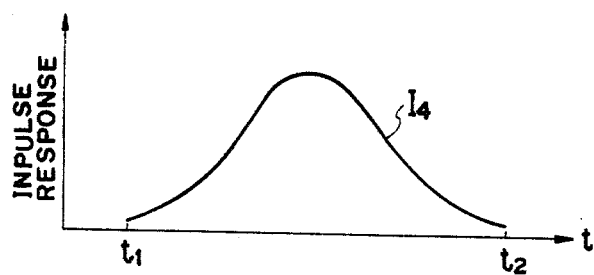
FIG. 14A is a characteristic curve showing another example of impulse response applied to the present invention.
Figure 14B:
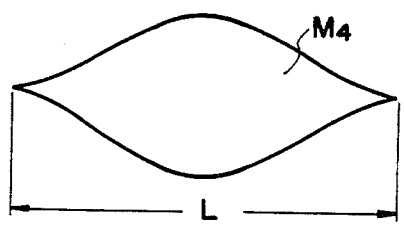
FIG. 14B is a plan view of an example of pumping electrode formed so as to correspond to the impulse response of FIG. 14A.

FIGS. 14A and 14B show another design example of pumping electrode. In this example, the desired frequency characteristic is in terms of Gauss function $e^{-2\pi^2 f^2}$ and the shape of the pumping electrode $M_4$ is formed so as to make impulse response equal to time response $I_4$ in Fourier transform relation with the Gauss function.

In this example, as compared with the characteristic $E_2$ of the ideal bandpass filter, there can be recognized slight deterioration in the knee characteristic of the filter, but the spurious response is improved. In addition, the shape and size of the pumping electrodes $M_1$, $M_2$ . . . can be selected within a practicable range. Thus, this example may be applicable as pumping electrode for the surface-acoustic-wave parametric device of FIG. 8.

The foregoing two examples as shown in FIGS. 12A to 15 are examples when the pumping voltages are small. When the pumping voltage is large and the parametric interaction is large, the relation between the impulse response and the shape of the parametric interaction region (pumping electrode) is somewhat deviated from the proportional relation. If an effect of this deviation is taken into consideration, a shape of the parametric interaction region (pumping electrode) for obtaining the desired frequency characteristic can be designed in a manner similar to that as described above.

Although the foregoing examples have been described in connection with the case where a backward wave output indicated by $SAW_3$ in FIG. 8 is derived as a surface-acoustic-wave output, similar design can be applied to a case where a surface-acoustic-wave output SAW$_2$ in the same direction as of the input surface acoustic wave SAW$_1$ is derived as an output.

However, in case of the surface acoustic wave SAW$_2$, a signal component having a frequency at which a parametric interaction is not caused is outputted as it is, without being subjected to modulation, and therefore an effect of improvement in spurious response is somewhat reduced.

The surface-acoustic-wave parametric device embodying the present invention is constructed as described above and will operate as follows:

A DC bias voltage of a suitable value is applied to the pumping electrode M from the DC power source 7, to cause a suitable depletion-layer capacitance on the surface of the semiconductor substrate 1 under the pumping electrode M. In addition, a pumping voltage having a frequency 2fo twice that of a center frequency fo at the desired frequency selection band is applied to the pumping electrode M from the high-frequency power source 9 to excite the depletion-layer capacitance as described above at the frequency 2fo and modulate the depletion-layer capacitance at the frequency 2fo.

On the other hand, an input electric signal applied to the wide-band input transducer 5 is converted to surface acoustic wave and propagated at the surface of the piezoelectric layer 3 rightwardly and leftwardly as viewed in FIG. 8 from the input transducer 5.

In the course of propagation of a signal component having a frequency around the frequency fo of the surface-acoustic-wave input signal SAW$_1$ propagating rightwardly, through the parametric interaction region beneath the pumping electrode M, the piezoelectric potential is subjected to the parametric interaction with the pumping voltage by the depletion-layer capacitance non-linearity effect at the surface of the semiconductor substrate 1 and the component is amplified so as to produce an output surface acoustic wave from the pumping electrode M rightwardly and leftwardly as viewed in FIG. 8.

The output surface acoustic wave SAW$_2$ travelling in the same direction as the input surface acoustic wave SAW$_1$ is converted into an electric signal by the output transducer 6 and outputted to the outside.

The output surface acoustic wave SAW$_3$ travelling in the direction opposite to that of the input surface acoustic wave SAW$_1$ is derived outside as an electric signal using the input transducer 5 or another suitable means, e.g., an output means having a multi-strip coupler as disclosed in Japanese Application No. 54-64923 (1979).

Since the shape of the parametric interaction region, namely, the pumping electrode M is formed corresponding to the desired frequency characteristic, only the signal component of the input surface acoustic wave SAW$_1$ which corresponds to the desired frequency characteristic is selectively outputted as the surface acoustic wave SAW$_2$ or SAW$_3$.

Figure 15:
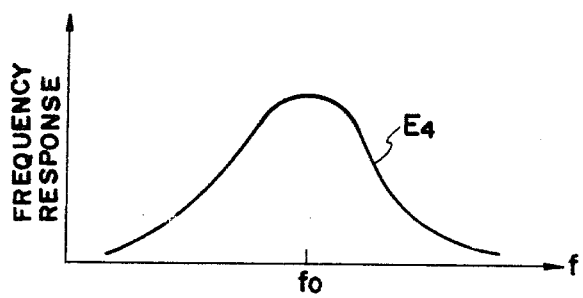
FIG. 15 is a characteristic curve showing an output frequency characteristic when the pumping electrode of FIG. 14B is applied to the device of FIG. 8.

For example, the output surface acoustic wave SAW$_3$ in the opposite direction to that of the input surface acoustic wave SAW$_1$ is outputted as a signal having the desired frequency characteristic as shown in FIG. 13 or 15, and the surface-acoustic-wave parametric device functions as a desired bandpass filter.

As to the output surface acoustic wave SAW$_2$ in the same direction as that of the input surface acoustic wave SAW$_1$, it is somewhat inferior in spurious response to the output surface acoustic wave SAW$_3$, but it is also outputted as a signal having the desired frequency characteristic.

As described above, in accordance with the present invention, the shape of the parametric interaction region i.e., the pumping electrode, is formed so as to correspond to a desired frequency characteristic of the output surface acoustic wave. When this surface-acoustic-wave parametric device is used as a variable frequency selecting device (a bandpass filter), it is very advantageous that it can be designed so as to conform with any desired output frequency characteristic.

In addition to the advantage as described above, the surface-acoustic-wave parametric device of the present invention has such advantages that a surface-acoustic-wave device generally has. For example, the device has a variable tuning characteristic over a wide frequency range, the stability of output center frequency can be determined by the stability of an external pumping power source, and the S/N ratio is very excellent.

We claim:

1. A surface-acoustic-wave parametric device which comprises:
a laminate formed of a semiconductor layer and a piezoelectric layer;
means for applying a pumping voltage to said laminate;
means for inputting surface acoustic wave to said laminate; and
means for outputting surface acoustic wave subjected to a parametric interaction;
said laminate having a parametric interaction region having a width perpendicular to a propagation direction of surface acoustic wave which varies, in the propagation direction of the surface acoustic wave, corresponding to a desired frequency characteristic of the output surface acoustic wave.

2. A device according to claim 1, wherein said means for outputting surface acoustic wave device is adapted to outputting surface acoustic wave travelling in the opposite direction to the input surface acoustic wave.

3. A device according to claim 1, wherein said means for applying pumping voltages includes a pumping power source and a pumping electrode connected to said pumping power source and disposed on a propagation path of the surface acoustic wave on the laminate, said pumping electrode has a form regulating the width of the parametric interaction region.

4. A device according to claim 3, wherein said pumping electrode is comprised of a plurality of electrode members, each of said electrode members corresponding to time response of the output surface acoustic wave responsive to an impulse signal applied to the input means, said electrode members being insulated from each other.

5. A device according to claim 3, wherein said pumping electrode is formed of at least one electrode member, said electrode member having a width corresponding to time response of the output surface acoustic wave within a range of from $-\pi$ to $\pi$ which is responsive to an impulse signal applied to the input means.

6. A device according to claim 1, which further comprises means for applying a DC bias voltage to said pumping electrode, said DC bias voltage causing a depletion layer capacitance.

7. A device according to claim 1, wherein said semiconductor layer is made of silicon and said piezoelectric layer is made of zinc oxide.

8. A device according to claim 1, wherein said semiconductor layer is made of silicon and said piezoelectric layer is aluminum nitride.

9. A device according to claim 1, 7 or 8, which further comprises an insulating film interposed between said semiconductor layer and said piezoelectric layer for surface passivation of the semiconductor layer.

10. A device according to claim 9, wherein said insulating film is made of a film of silicon dioxide.

* * * * *